(12) United States Patent
Wang

(10) Patent No.: US 11,316,134 B2
(45) Date of Patent: Apr. 26, 2022

(54) DISPLAY PANEL, METHOD FOR MANUFACTURING THE SAME, AND METHOD FOR DETECTING THE SAME

(71) Applicant: TCL CHINA STAR OPTOELECTRONICS TECHNOLOGY CO., LTD., Guangdong (CN)

(72) Inventor: Guojie Wang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 27 days.

(21) Appl. No.: 16/618,811

(22) PCT Filed: Nov. 12, 2019

(86) PCT No.: PCT/CN2019/117563
§ 371 (c)(1),
(2) Date: Dec. 3, 2019

(87) PCT Pub. No.: WO2021/072858
PCT Pub. Date: Apr. 22, 2021

(65) Prior Publication Data
US 2021/0119182 A1     Apr. 22, 2021

(51) Int. Cl.
*H01L 51/52*     (2006.01)
*G01N 21/51*     (2006.01)
*G01N 21/958*    (2006.01)

(52) U.S. Cl.
CPC ......... *H01L 51/5259* (2013.01); *G01N 21/51* (2013.01); *G01N 21/958* (2013.01); *H01L 51/524* (2013.01)

(58) Field of Classification Search
CPC ... H01L 51/5259; H01L 51/524; G01N 21/51; G01N 21/958; G01N 2021/4773; G01M 3/00; G01M 3/38
(Continued)

(56) References Cited

U.S. PATENT DOCUMENTS

2011/0285277 A1\* 11/2011 Boerner ............. H01L 51/5203
                                                   313/504
2012/0258294 A1\* 10/2012 Leyder ............... H01L 51/5256
                                                   428/212
(Continued)

FOREIGN PATENT DOCUMENTS

CN      101286468 A     10/2008
CN      102037396 A      4/2011
(Continued)

*Primary Examiner* — Tri T Ton
(74) *Attorney, Agent, or Firm* — Mark M. Friedman

(57) ABSTRACT

A display panel and a method for manufacturing the same are provided. The display panel includes a display area and a non-display area. The display panel further includes a substrate, a cover plate, an encapsulation assembly, an at least one diffusion layer. The cover plate is disposed opposite to the substrate. The encapsulation assembly is disposed between the cover plate and the substrate and disposed in the non-display area. The at least one diffusion layer is disposed on the substrate and disposed between the encapsulation assembly and the display area. Diffusion occurs when the diffusion layer encounters water.

7 Claims, 3 Drawing Sheets

(58) Field of Classification Search
USPC .................. 356/239.1–239.8, 237.1–237.6
See application file for complete search history.

(56) References Cited

U.S. PATENT DOCUMENTS

2014/0030833 A1    1/2014  Sato et al.
2014/0346502 A1*  11/2014  Matsukizono ...... H01L 27/1225
                                                                    257/43

FOREIGN PATENT DOCUMENTS

| CN | 106024842 A | 10/2016 |
| CN | 107887527 A | 4/2018 |
| CN | 108649063 A | 10/2018 |
| CN | 108807719 A | 11/2018 |

* cited by examiner

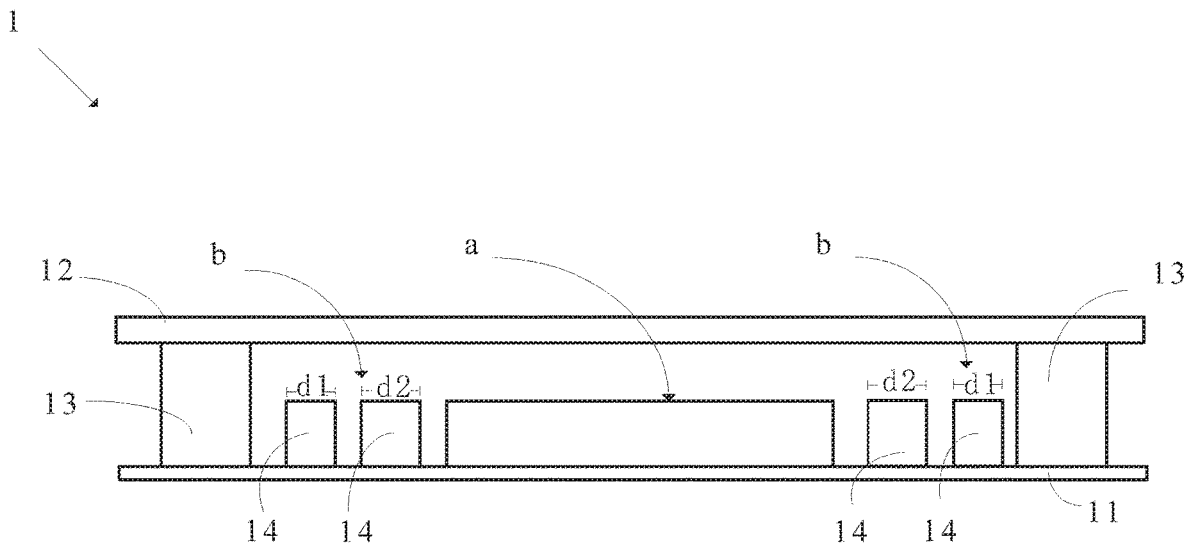

FIG. 3

S101
Provide a substrate and a cover plate, the cover plate have an encaspsulation assembly thereon, and the encapsulation assembly is disposed in the non-display area S102
Form at least one diffusion layer on the substrate, and the diffusion layer is disposed in the non-display area, wherein diffusion occurs when the diffusion layer encounters water S103
Bind the substrate and the cover plate by the encapsulation assembly, so that the diffusion layer is disposed between the encapsulation assembly and the display area

FIG. 4

DISPLAY PANEL, METHOD FOR MANUFACTURING THE SAME, AND METHOD FOR DETECTING THE SAME

FIELD OF INVENTION

The present disclosure relates to the field of display technology, and particularly relates to a display panel, a method for manufacturing the same, and a method for detecting the same.

BACKGROUND OF INVENTION

Since an organic light-emitting diode (OLED) has advantages, such as self-luminescence, low power consumption, and wide color gamut, the OLED is more and more widely used.

The OLED is very sensitive to water vapor, so an encapsulation structure is needed to protect the OLED. However, due to the influence from processes, such as thinning, cutting, and panel testing, the encapsulation structure of the OLED is prone to fail, and internal components thereof are easily corroded by water and oxygen, resulting in OLED failure.

Therefore, it is necessary to provide a display panel which can reflect whether the performance of the encapsulation structure of the OLED fails or not.

SUMMARY OF INVENTION

Technical Problems

An object of the present disclosure is to provide a display panel, a method for manufacturing the same, and a method for detecting the same, so as to improve the accuracy of the performance detection of the display panel.

Technical Solutions

An embodiment of the present disclosure provides a display panel. The display panel comprises a display area and a non-display area. The non-display area is disposed around the display area, and the display panel further comprises a substrate, a cover plate, an encapsulation assembly, and at least one diffusion layer.

The cover plate is disposed opposite to the substrate.

The encapsulation assembly is disposed between the cover plate and the substrate and disposed in the non-display area.

The at least one diffusion layer is disposed on the substrate and disposed between the encapsulation assembly and the display area. The diffusion occurs when the diffusion layer encounters water According to an embodiment, the display panel further comprises a detection unit.

The detection unit is used to detect whether the diffusion occurs to the diffusion layer or not. If the diffusion occurs, it is determined that the encapsulation assembly fails.

According to an embodiment, a constituent material of the diffusion layer comprises one or more of a polymer resin material, a water-absorbing metal, or a water-absorbing metal oxide.

According to an embodiment, a constituent material of the diffusion layer comprises lithium fluoride, magnesium fluoride, or sodium fluoride.

According to an embodiment, the display panel comprises a cathode overlapping area.

The cathode overlapping area is disposed between the encapsulation assembly and the display area.

The diffusion layer is disposed on the cathode overlapping area.

According to an embodiment, when the display panel comprises a plurality of diffusion layers, the plurality of diffusion layers are sequentially spaced apart between the encapsulation assembly and the display area. A width of the diffusion layer away from the display area is smaller than a width of the diffusion layer near the display area.

According to an embodiment, the diffusion layer is disposed around the display area or disposed on one side of the display area.

An embodiment of the present disclosure also provides a method for manufacturing a display panel. The display panel comprises a display area and a non-display area. The method comprises the following steps.

A substrate and a cover plate are provided. The cover plate has an encapsulation assembly thereon, and the encapsulation assembly is disposed in the non-display area.

At least one diffusion layer is formed on the substrate. The diffusion layer is disposed in the non-display area. The diffusion occurs when the diffusion layer encounters water.

The substrate and the cover plate are bound by the encapsulation assembly, so that the diffusion layer is disposed between the encapsulation assembly and the display area.

Further, an embodiment of the present disclosure also provides a method for detecting a display panel used to detect whether an encapsulation assembly in the display panel fails or not. The display panel is provided with a diffusion layer, and the diffusion layer is disposed between the encapsulation assembly and a display area of the display panel. The method comprises the following steps.

Whether diffusion occurs to the diffusion layer or not is detected every predetermined period of time.

If no diffusion occurs, whether the diffusion occurs to the diffusion layer or not is continued to detect every predetermined period of time.

If the diffusion occurs, it is determined that the encapsulation assembly fails.

According to an embodiment, the step of detecting whether the diffusion occurs to the diffusion layer or not every predetermined period of time further comprises the following steps.

A current pattern of the diffusion layer is obtained every predetermined period of time.

Whether the current pattern of the diffusion layer matches an initial pattern of the diffusion layer or not is determined.

If so, it is determined that no diffusion occurs to the diffusion layer.

If not, it is determined that the diffusion occurs to the diffusion layer.

According to an embodiment, the step of detecting whether the diffusion occurs to the diffusion layer or not every predetermined period of time further comprises the following steps.

A current light transmittance of the diffusion layer is obtained every predetermined period of time.

Whether the current light transmittance of the diffusion layer is the same as an initial light transmittance of the diffusion layer or not is determined.

If so, it is determined that no diffusion occurs to the diffusion layer.

If not, it is determined that the diffusion occurs to the diffusion layer.

Beneficial Effects

In the display panel, the method for manufacturing the display panel, and the method for detecting the display panel of the embodiment in the present disclosure, by disposing the diffusion layer, whether the encapsulation assembly fails or not can be determined according to whether the diffusion occurs to the diffusion layer or not, and the accuracy of the performance detection of the display panel is improved.

DESCRIPTION OF DRAWINGS

In order to make the above content of the present disclosure clearly understood, the preferable embodiments are exemplified as follows in conjunction with the accompanying drawings and the detailed description.

FIG. 3 is another schematic structural diagram of a display panel according to an embodiment of the present disclosure.

FIG. 4 is a schematic flow chart of a method for manufacturing a display panel according to an embodiment of the present disclosure.

DETAILED DESCRIPTION OF PREFERRED EMBODIMENTS

Figure 1:
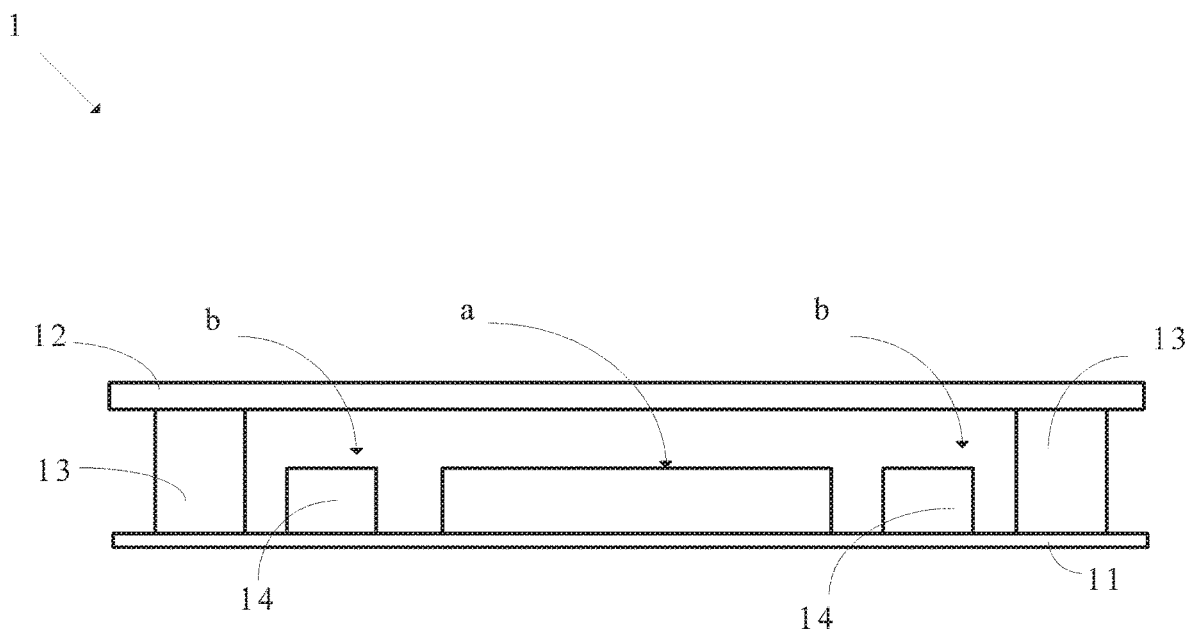
FIG. 1 is a schematic structural diagram of a display panel according to an embodiment of the present disclosure.

The following description of every embodiment, with reference to the accompanying drawings, is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure.

In the drawings, the components having similar structures are denoted by the same numerals.

Reference herein to "implementation" means that specific features, structures, or characteristic described in connection with the implementations may be included in at least one implementation of the disclosure. The appearances of the phrase in various places in the specification are not necessarily all referring to the same implementation, nor are separate or alternative implementations mutually exclusive of other implementations. As one of ordinary skill in the art explicitly and implicitly appreciate, the implementations described herein may be combined with other implementations.

Referring to FIG. 1, FIG. 1 is a schematic structural diagram of a display panel according to an embodiment of the present disclosure. A display panel 1 comprises a display area a and a non-display area b. The non-display area b is disposed around the display area a. The display area a is used for screen display.

The display panel 1 further comprises a substrate 11, a cover plate 12, an encapsulation assembly 13, and at least one diffusion layer 14. The substrate 11 may be a rigid substrate or a rigid substrate. A structure, such as a thin film transistor layer, an electroluminescent device layer, or the like, is disposed on the substrate 11. The cover plate 12 is disposed opposite to the substrate 11.

The encapsulation assembly 13 is disposed between the cover plate 12 and the substrate 11, and the encapsulation assembly 13 is disposed in the non-display area b. The encapsulation assembly 13 may be composed of a plurality of inorganic-organic thin films for preventing the erosion of external water and oxygen. If the encapsulation assembly 13 fails, the external water and oxygen invades, thereby damaging other components in the display panel 1.

Figure 2:
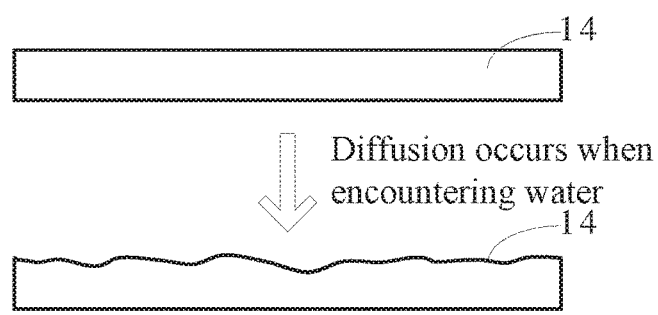
FIG. 2 is a diffusion scene of a diffusion layer according to an embodiment of the present disclosure.

The at least one diffusion layer 14 is disposed on the substrate 11, and the diffusion layer 14 is disposed between the encapsulation assembly 13 and the display area a. After water vapor enters the diffusion layer 14 through the encapsulation assembly 13, when a constituent material of the diffusion layer 14 encounters water, diffusion occurs to the constituent material. Particularly, a portion of the material of the diffusion layer 14 reacts with the water, resulting in diffusion and agglomeration. As shown in FIG. 2, the diffusion layer 14 is originally in a flat state, and a surface of the diffusion layer 14 may be convex or concave after absorbing water.

In an embodiment, the diffusion layer 14 may be disposed around the display area a, or may be disposed on one side of the display area a, particularly according to the area size of the non-display area b and other layout requirements.

In an embodiment, as shown in FIG. 3, when the display panel 1 comprises a plurality of diffusion layers 14, the plurality of diffusion layers 14 are sequentially spaced apart between the encapsulation assembly 13 and the display area a. The plurality of diffusion layers 14 have different widths. To easily observe whether the encapsulation assembly 13 fails or not, the width of the diffusion layer away from the display area is disposed to be smaller than the width of the diffusion layer near the display area. Particularly, as shown in FIG. 3, the width of the diffusion layer 14 away from the display area a is d1, and the width of the diffusion layer 14 near the display area a is d2. A value of d1 is smaller than that of d2. Further, the diffusion layer 14 near the display area a may also be used as a protective layer for the display area a, which continues to protect the components in the display panel a after the diffusion layer 14 away from the display area a fails.

In an embodiment, the display panel 1 further comprises a cathode overlapping area. The cathode overlapping area is disposed between the encapsulation assembly 13 and the display area a. The cathode overlapping area is only provided with a cathode, and there is no other organic material. By disposing the diffusion layer 14 above the cathode overlapping area, a narrow frame can be achieved and without affecting the layout of other components in the display panel 1.

A constituent material of the diffusion layer 14 comprises one or more of a polymer resin material, a water-absorbing metal, or a water-absorbing metal oxide. The water-absorbing metal comprises calcium, magnesium, etc. The water-absorbing metal oxide comprises magnesium oxide, calcium oxide, etc. Further, the constituent material of the diffusion layer 14 may further comprise lithium fluoride, magnesium fluoride, or sodium fluoride.

In an embodiment, the display panel 1 further comprises a detection unit. The detection unit is used to detect whether the diffusion occurs to the diffusion layer 14 or not. If the diffusion occurs to the diffusion layer 14, the detection unit determines that the encapsulation assembly 13 fails. The detection unit can scan and image the diffusion layer, and determine whether the diffusion occurs to the diffusion layer 14 or not by comparing a current pattern with an initial pattern of the diffusion layer, wherein the initial pattern of the diffusion layer 14 refers to a pattern when the diffusion layer 14 is just formed. In an embodiment, the detection unit may be used to detect a light transmittance of the diffusion layer 14. The detection unit detects whether the diffusion occurs to the diffusion layer 14 or not by determining whether the light transmittance of the diffusion layer 14 changes or not.

An embodiment of the present disclosure also provides a method for manufacturing a display panel. The display panel comprises a display area and a non-display area. The non-display area is disposed around the display area. Referring to FIG. 4, FIG. 4 is a schematic flow chart of a method for manufacturing a display panel according to an embodiment of the present disclosure. The manufacturing method comprises the steps as follows.

A step S101, a substrate and a cover plate are provided. The cover plate has an encapsulation assembly thereon, and the encapsulation assembly is disposed in the non-display area.

The substrate may be a rigid substrate or a rigid substrate. A structure, such as a thin film transistor layer, an electroluminescent device layer, or the like, is disposed on the substrate.

The encapsulation assembly is disposed in the non-display area. The encapsulation assembly may be composed of a plurality of inorganic-organic thin films for preventing the erosion of external water and oxygen. If the encapsulation assembly fails, the external water and oxygen invades, thereby damaging other components in the display panel.

A step S102, at least one diffusion layer is formed on the substrate. The diffusion layer is disposed in the non-display area, and when the diffusion layer encounters water, the diffusion occurs to the diffusion layer.

The at least one diffusion layer 14 is disposed on the substrate 11, and the diffusion layer 14 is disposed between the encapsulation assembly 13 and the display area a. After water vapor enters the diffusion layer 14 through the encapsulation assembly 13, when a constituent material of the diffusion layer 14 encounters water, the diffusion occurs to the diffusion layer. Particularly, a portion of the material of the diffusion layer 14 reacts with the water, resulting in diffusion and agglomeration. As shown in FIG. 2, the diffusion layer 14 is originally in a flat state, and a surface of the diffusion layer 14 may be convex or concave after absorbing water.

In an embodiment, the diffusion layer 14 may be disposed around the display area a, or may be disposed on one side of the display area a, particularly according to the area size of the non-display area b and other layout requirements.

In an embodiment, as shown in FIG. 3, when the display panel 1 comprises a plurality of diffusion layers 14, the plurality of diffusion layers 14 are sequentially spaced apart between the encapsulation assembly 13 and the display area a. The plurality of diffusion layers 14 have different widths. To easily observe whether the encapsulation assembly 13 fails or not, the width of the diffusion layer away from the display area is disposed to be smaller than the width of the diffusion layer near the display area. Particularly, as shown in FIG. 3, the width of the diffusion layer 14 away from the display area a is d1, and the width of the diffusion layer 14 near the display area a is d2. A value of d1 is smaller than that of d2. Further, the diffusion layer 14 near the display area a may also be used as a protective layer for the display area a, which continues to protect the components in the display panel a after the diffusion layer 14 away from the display area a fails.

In an embodiment, the display panel 1 further comprises a cathode overlapping area. The cathode overlapping area is disposed between the encapsulation assembly 13 and the display area a. The cathode overlapping area is only provided with a cathode, and there is no other organic material. By disposing the diffusion layer 14 above the cathode overlapping area, a narrow frame can be achieved and without affecting the layout of other components in the display panel 1.

A constituent material of the diffusion layer 14 comprises one or more of a polymer resin material, a water-absorbing metal, or a water-absorbing metal oxide. The water-absorbing metal comprises calcium, magnesium, etc. The water-absorbing metal oxide comprises magnesium oxide, calcium oxide, etc. Further, the constituent material of the diffusion layer 14 may further comprise lithium fluoride, magnesium fluoride, or sodium fluoride.

A step S103, the substrate and the cover plate are bound by the encapsulation assembly, so that the diffusion layer is disposed between the encapsulation assembly and the display area.

Particularly, the cover plate is aligned with and bound to the substrate, and the glass glue in an encapsulation layer is melted by a laser to bind the cover plate and the substrate together. The diffusion layer is disposed between the encapsulation assembly and the display area.

Figure 5:
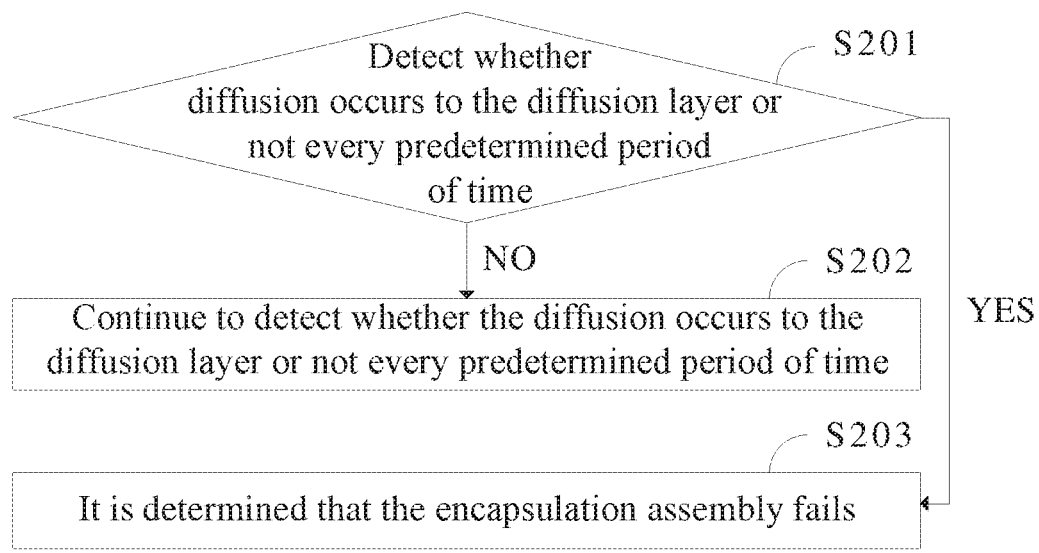
FIG. 5 is a schematic flow chart of a method for detecting a display panel according to an embodiment of the present disclosure.

Furthermore, an embodiment of the present disclosure also provides a method for detecting a display panel, which is used to detect whether an encapsulation assembly in the display panel fails or not. The display panel is provided with a diffusion layer, and the diffusion layer is disposed between the encapsulation assembly and a display area of the display panel. Referring to FIG. 5, FIG. 5 is a schematic flow chart of a method for detecting a display panel according to an embodiment of the present disclosure. The detecting method comprises the steps as follows.

A step S201, whether diffusion occurs to the diffusion layer or not is detected every predetermined period of time.

In an embodiment, the step of detecting whether the diffusion occurs to the diffusion layer or not every predetermined period of time comprises the following steps.

A current pattern of the diffusion layer is obtained every predetermined period of time.

Whether the current pattern of the diffusion layer matches an initial pattern of the diffusion layer or not is determined.

If so, it is determined that no diffusion occurs to the diffusion layer.

If not, it is determined that the diffusion occurs to the diffusion layer.

According to the principle of light emission and the characteristics of the reflection ability for the light of the constituent material in the diffusion layer, the pattern of the diffusion layer can be obtained. Particularly, an optical automatic detecting assembly may be integrated in the display panel, and then the diffusion layer is scanned and imaged by the optical automatic detecting assembly every predetermined period of time, so as to obtain a current pattern of the diffusion layer.

The initial pattern of the diffusion layer refers to a pattern when the diffusion layer is just formed, and the initial pattern may be pre-collected and stored. When the current pattern of the diffusion layer needs to be compared, the initial pattern is recalled for comparison.

If the diffusion layer absorbs water, the constituent material of the diffusion layer reacts with the water to cause diffusion and agglomeration. Thus, the obtained current pattern of the diffusion layer scanned by the optical automatic detecting assembly may not match the initial pattern. If the diffusion layer does not absorb the water, the diffusion layer does not change. Thus, the obtained current pattern of the diffusion layer scanned by the optical automatic detecting assembly may match the initial pattern.

If the current pattern of the diffusion layer matches the initial pattern of the diffusion layer, it means that the diffusion does not occur and the diffusion layer does not absorb the water. That is, the encapsulation assembly effectively blocks the external water vapor. If the current pattern of the diffusion layer does not match the initial pattern of the diffusion layer, it means that the diffusion occurs and the diffusion layer absorbs the water. That is, the encapsulation assembly fails, resulting in the invasion of the external water vapor.

In an embodiment, the step of detecting whether the diffusion occurs to the diffusion layer or not every predetermined period of time comprises the following steps.

A current light transmittance of the diffusion layer is obtained every predetermined period of time.

Whether the current light transmittance of the diffusion layer is the same as an initial light transmittance of the diffusion layer or not is determined.

If so, it is determined that no diffusion occurs to the diffusion layer.

If not, it is determined that the diffusion occurs to the diffusion layer.

After the water vapor enters the diffusion layer 14 through the encapsulation assembly, when the constituent material of the diffusion layer encounters water, the diffusion occurs to the diffusion layer. Particularly, a portion of the material of the diffusion layer reacts with the water, resulting in diffusion and agglomeration. If the diffusion layer is originally in a flat state, the surface of the diffusion layer may be convex or concave after absorbing water. Thus, the light transmittance of the diffusion layer may change.

The initial light transmittance of the diffusion layer refers to the light transmittance when the diffusion layer is just formed, and the initial light transmittance may be pre-collected and stored. When the current light transmittance of the diffusion layer needs to be compared, the initial light transmittance is recalled for comparison.

If the current light transmittance of the diffusion layer is the same as the initial light transmittance, it means that the diffusion and agglomeration does not occur to the diffusion layer. That is, the diffusion layer does not absorb the water, and the encapsulation assembly effectively blocks the external water vapor. If the current light transmittance of the diffusion layer is not the same as the initial light transmittance, it means that the diffusion and agglomeration occurs to the diffusion layer. That is, the diffusion layer absorbs the water. The encapsulation assembly fails, resulting in the invasion of the external water vapor.

A step S202, if no diffusion occurs, whether the diffusion occurs to the diffusion layer or not is continued to detect every predetermined period of time.

To sum up, if the diffusion does not occur to the diffusion layer, whether the diffusion occurs to the diffusion layer or not continues to be detected every predetermined period of time for continuous monitoring.

A step S203, if the diffusion occurs, it is determined that the encapsulation assembly fails.

If the diffusion occurs to the diffusion layer, the repair of the encapsulation assembly is prompted.

In the display panel, the method for manufacturing the display panel, and the method for detecting the display panel of the embodiment in the present disclosure, by disposing the diffusion layer, whether the encapsulation assembly fails or not can be determined according to whether the diffusion occurs to the diffusion layer or not, and the accuracy of the performance detection of the display panel is improved.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A display panel, comprising a display area and a non-display area, the non-display area being disposed around the display area, wherein the display area is configured for screen display, and the display panel further comprising:
   a substrate;
   a cover plate disposed opposite to the substrate;
   an encapsulation assembly disposed between the cover plate and the substrate and disposed in the non-display area; and
   a plurality of diffusion layers disposed on the substrate and disposed between the encapsulation assembly and the display area, wherein diffusion occurs when at least one of the diffusion layers encounters water,
   wherein the diffusion layers are sequentially spaced apart between the encapsulation assembly and the display area, wherein a width of the diffusion layer away from the display area is smaller than a width of the diffusion layer near the display area.

2. The display panel according to claim 1, further comprising:
   a detection unit, used to detect whether the diffusion occurs to the diffusion layer or not, and if the diffusion occurs, it is determined that the encapsulation assembly fails.

3. The display panel according to claim 1, wherein a constituent material of the diffusion layer comprises one or more of a polymer resin material, a water-absorbing metal, or a water-absorbing metal oxide.

4. The display panel according to claim 1, wherein a constituent material of the diffusion layer comprises lithium fluoride, magnesium fluoride, or sodium fluoride.

5. The display panel according to claim 1, comprising:
   a cathode overlapping area, disposed between the encapsulation assembly and the display area;
   wherein the diffusion layer is disposed on the cathode overlapping area.

6. The display panel according to claim 1, wherein the diffusion layer is disposed around the display area, or disposed on one side of the display area.

7. A method for manufacturing a display panel, the display panel comprising a display area and a non-display area, and the non-display area being disposed around the display area, wherein the method for manufacturing the display panel comprises:
   providing a substrate and a cover plate, the cover plate having an encapsulation assembly thereon, and the encapsulation assembly being disposed in the non-display area;

forming a plurality of diffusion layers on the substrate, the diffusion layers being disposed in the non-display area, wherein diffusion occurs when at least one of the diffusion layers encounters water; and binding the substrate and the cover plate by the encapsulation assembly, so that the diffusion layers are disposed between the encapsulation assembly and the display area, wherein the diffusion layers are sequentially spaced apart between the encapsulation assembly and the display area, wherein a width of the diffusion layer away from the display area is smaller than a width of the diffusion layer near the display area.

* * * * *